United States Patent [19]
Malec

[11] Patent Number: 5,150,072
[45] Date of Patent: Sep. 22, 1992

[54] DISTORTION CORRECTION FOR AN AMPLIFIER SYSTEM

[75] Inventor: Jeffrey M. Malec, Quincy, Ill.

[73] Assignee: Harris Corporation, Melbourne, Fla.

[21] Appl. No.: 776,829

[22] Filed: Oct. 15, 1991

[51] Int. Cl.$^5$ .............................................. H03F 1/26
[52] U.S. Cl. ...................................... 330/149; 330/10; 332/159; 455/108; 455/127
[58] Field of Search .................... 330/10, 149, 207 A, 330/251; 332/107, 159; 455/108, 127

[56] References Cited

U.S. PATENT DOCUMENTS

| | | | |
|---|---|---|---|
| 4,580,111 | 4/1986 | Swanson | 332/152 |
| 4,605,910 | 8/1986 | Covill | 332/109 |
| 4,737,731 | 4/1988 | Swanson et al. | 330/10 X |

*Primary Examiner*—James B. Mullins
*Attorney, Agent, or Firm*—Tarolli, Sundheim & Covell

[57] ABSTRACT

An amplifier system is disclosed having improved distortion reduction. This system includes a DC voltage source having AC and DC components. An input signal to be amplified is supplied to an amplifier coupled to a DC voltage source for amplifying the input signal to provide an output signal in accordance therewith. Correction signal circuitry is provided including circuitry for separating the AC and DC components and varying the magnitude and phase of the AC component independently of the DC component to provide an adjusted AC component. The DC component and the adjusted AC component are summed together to provide an adjusted correction signal which is then combined with the input signal prior to application of the input signal to the amplifier.

15 Claims, 5 Drawing Sheets

DISTORTION CORRECTION FOR AN AMPLIFIER SYSTEM

BACKGROUND OF THE INVENTION

The present invention relates to amplifiers such as those employed in AM broadcasting and, more particularly, to such amplifiers including mean for minimizing distortion and noise resulting from variations in the DC power supply.

It is known that noise and/or other variations appearing on the output of a DC power supply connected to the input of an amplifier may result in distortion. The power supply noise is of particular concern in high power amplifiers, such as those found in transmitters conventionally used in commercial AM broadcasting. It is known to employ large capacitors connected across the power supply to reduce low frequency AC supply voltage variations caused by power supply ripple and low frequency transmitter modulation. These power supply variations may well be reduced substantially by connecting a large amount of capacitance across the power supply output. However, such capacitors employed with high power DC power sources are quite large both in volume and in weight. The inclusion of such capacitors is undesirable from the standpoint of cost, size and weight.

It is also known that some AM transmitter circuits employ a low frequency distortion correction circuit that takes a sample of the power supply output and then generates a correction signal that is used to compensate for power supply sag. Such prior art circuits include, for example, the U.S. Pat. Nos. to H. I. Swanson et al., 4,731,731, H. I. Swanson, 4,580,111, and D. H. Covill, 4,605,910. Each of these patents discloses circuitry for minimizing modulation distortion of an amplitude modulated RF carrier signal resulting from variations in the DC power supply. In each case, a feed forward technique is employed in which a sample of the input DC voltage signal is obtained and is combined with the input audio signal to compensate for variations in the magnitude of the DC supply voltage prior to supplying the input audio signal to the amplification stages of the transmitter.

In the prior art discussed immediately above, the AC and DC components of the power supply sample are used for both long term DC supply changes and short term sags such as power supply ripple or low frequency transmitter modulation. In low power transmitters, correction loops typically treated the AC and DC components equally in terms of phase and gain of the signals, since large amounts of supply filter capacitance were practical in most cases. However, with higher power transmitters, such as those exceeding 50 kilowatts, the cost of such filter capacitance prohibits their use for minimizing power supply sag. Moreover, at higher power levels, the transmitters tax the AC main input lines and may possibly cause additional power supply sag with modulation. In view of these factors, it has been found desirable that the AC component of the power supply sample be separated from the DC component so that additional gain and phase correction may be made to the AC component independent of variations in the DC component to achieve optimum low frequency distortion and minimum AM noise.

SUMMARY OF THE INVENTION

It therefore a primary object of the present invention to provide a correction signal wherein the phase and gain of the AC component of the power supply sample may be varied independently of the DC component.

In accordance with the present invention, an amplifier system is provided having improved distortion reduction. This system includes a DC voltage source having AC and DC components. An input signal to be amplified is supplied to an amplifier coupled to a DC voltage source for amplifying the input signal to provide an output signal in accordance therewith. Correction signal circuitry is provided and includes circuitry for separating the AC and DC components and varying the magnitude and phase of the AC component independently of the DC component to provide an adjusted AC component. The DC component and the adjusted AC component are summed together to provide an adjusted correction signal which is then combined with the input signal prior to application of the input signal to the amplifier.

In accordance with another aspect of the present invention, the amplifier system is an RF amplifier system and the amplifier means includes a plurality of actuatable RF power amplifiers each connected to the DC voltage source and each, when actuated, for receiving and amplifying an RF drive signal with each power amplifier having an output circuit for providing an RF output signal. One or more of the RF amplifiers are actuated in dependence upon the magnitude of the input signal. The RF output signals are then additively combined to provide a combined RF output signal. The adjusted correction signal and the input signal are combined prior to actuation of one or more of the RF amplifiers.

BRIEF DESCRIPTION OF THE DRAWINGS

The foregoing and other objects and advantages of the present invention will become more readily apparent from the following description as taken in conjunction with the accompanying drawings, wherein.

DESCRIPTION OF THE PREFERRED EMBODIMENT

One application of the present invention is in conjunction with the use of RF power amplifiers employed in AM broadcast transmitters. An example of such a transmitter is presented in FIG. 1 and takes the form of a digital amplitude modulator such as that illustrated and described in the aforesaid U.S. Pat. No. 4,580,111, which is assigned to the same assignee as the present invention, the disclosure of which is herein incorporated by reference.

Figure 1:
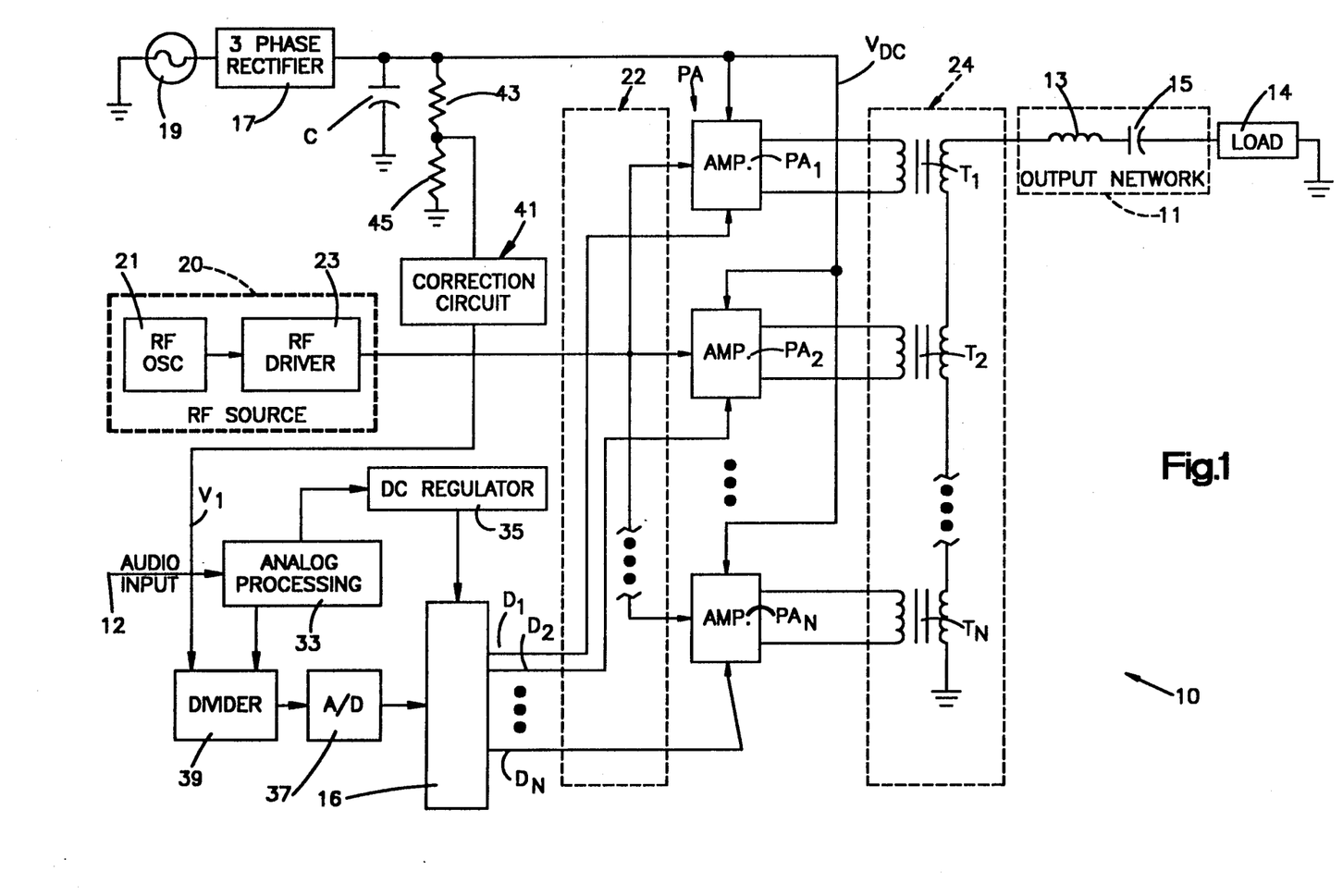
FIG. 1 is a schematic-block diagram illustration of one application to which the present invention may be applied.
Figure 2:
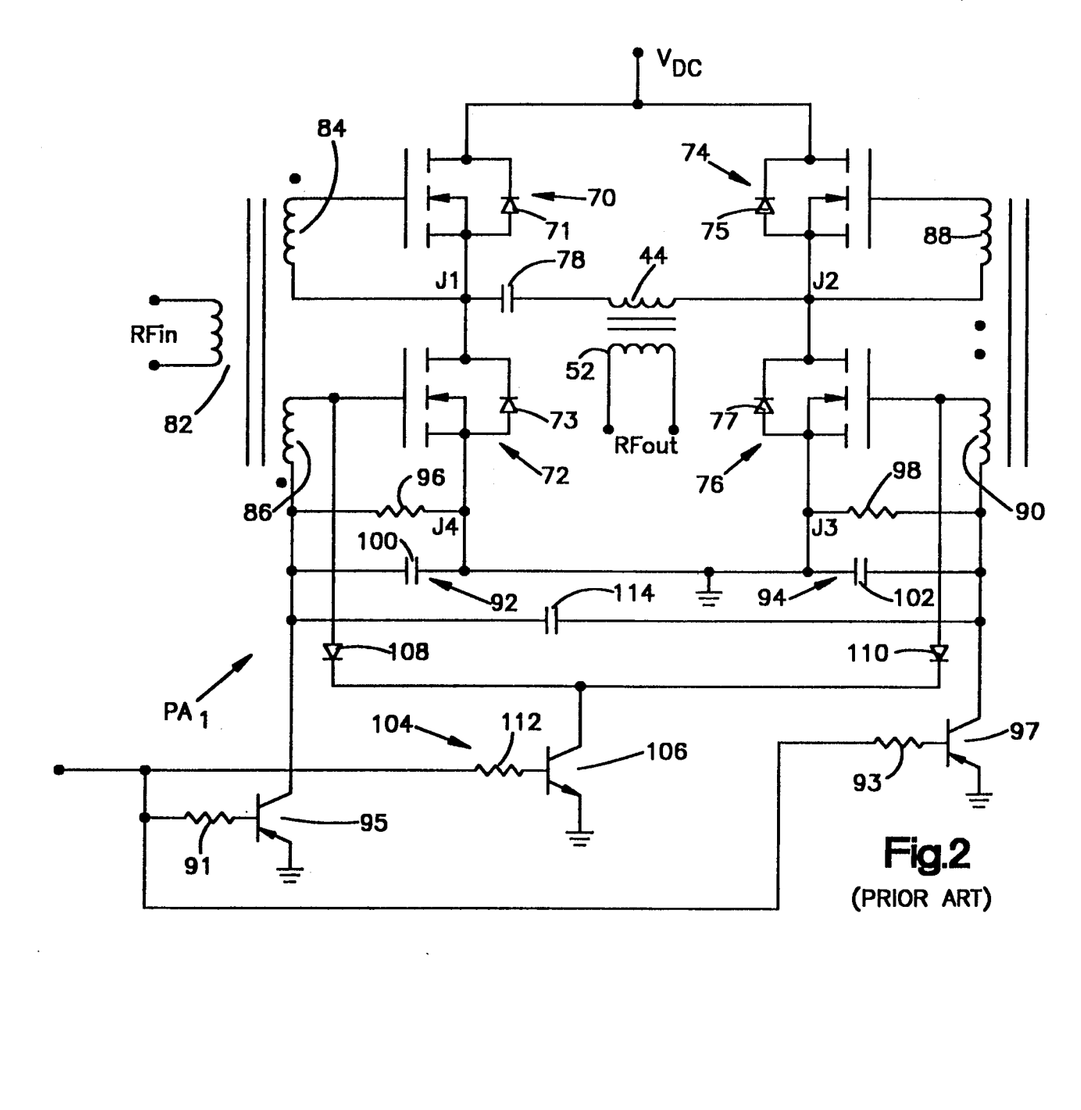
FIG. 2 is a prior art schematic circuit illustration of one of the power amplifiers employed in FIG. 1.
Figure 2A:
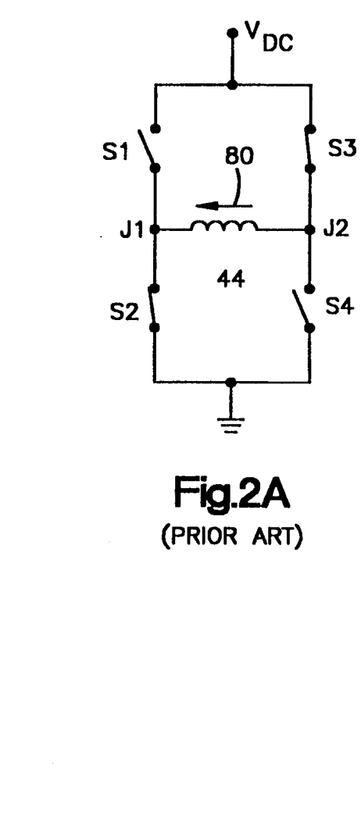
FIG. 2A is a prior art simplified schematic circuit useful in understanding the operation of the circuit shown in FIG. 2.
Figure 3:
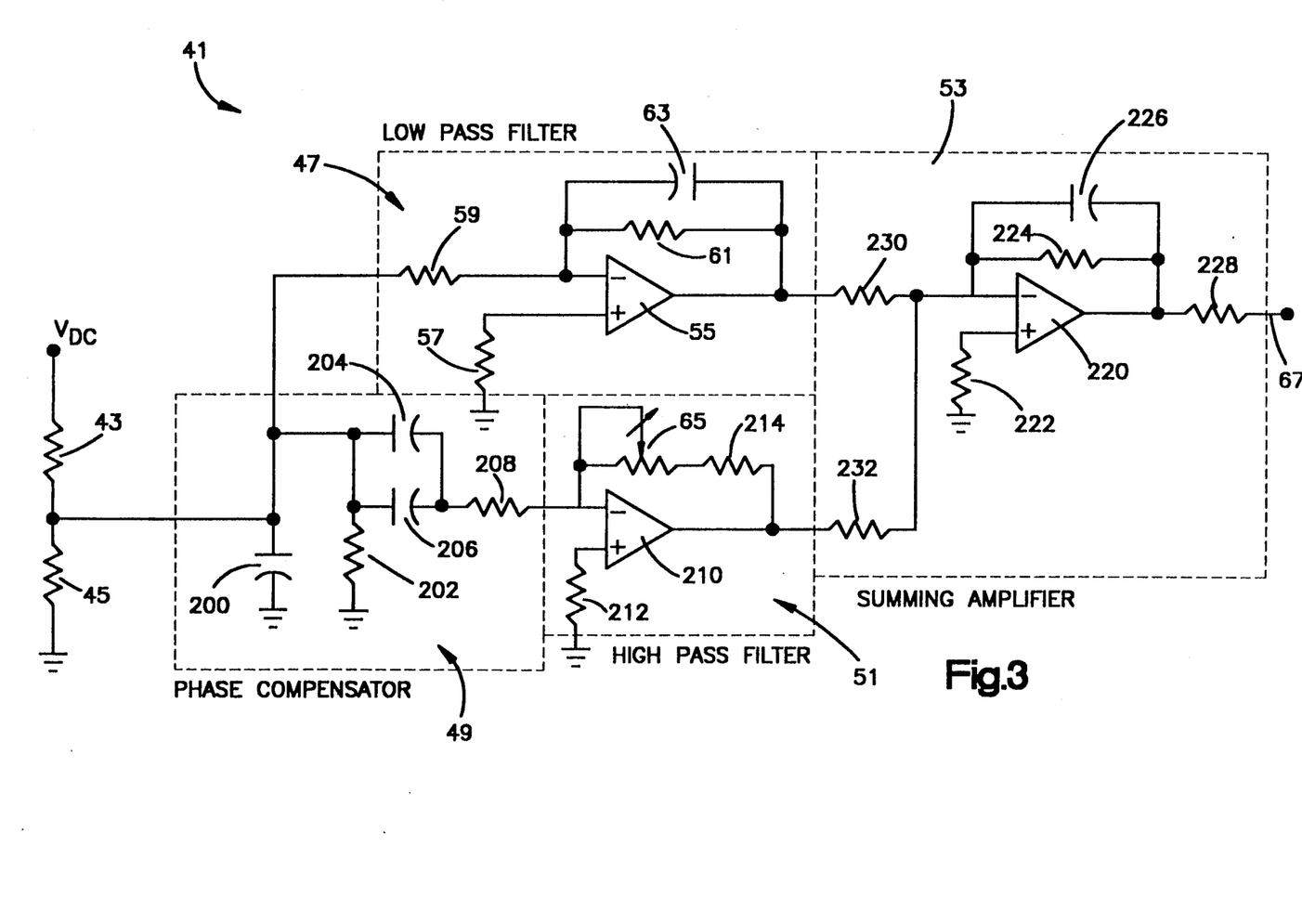
FIG. 3 is a schematic-block diagram of the correction circuit in accordance with the present invention.

The discussion which follows is directed to an explanation of the operation of the circuitry shown in FIG. 1 followed by a detailed description of a power amplifier as illustrated in FIGS. 2 and 2A herein as background for the discussion of the invention presented with respect to the embodiment illustrated herein in FIG. 3.

Referring now to FIG. 1, the amplitude modulator 10 is illustrated as receiving an input signal from input source 12 which may be the source of an audio signal. Modulator 10 generates an RF carrier signal which is amplitude modulated as a function of the amplitude of the input signal from source 12. The amplitude modulated carrier signal is provided on an output line connected to a load 14, which may take the form of an RF transmitting antenna. A digitizer 16 provides a plurality of digital control signals D1 through DN which have values which vary in accordance with the instantaneous level of the input signal. The control signals are binary signals each having a binary 1 or a binary 0 level. The number of signals having binary 1 or binary 0 levels is dependent upon the instantaneous level of the input signal.

Each of the output control signals D1-DN is supplied to one of a plurality of N RF power amplifiers $PA_1$-- $PA_N$. The control signals serve to turn associated power amplifiers either on or off. Thus, if the control signal has a binary 1 level, then its associated amplifier is inactive and no signal is provided at its output. However, if the control signal is of a binary 0 level, then the power amplifier is active and an amplified carrier signal is provided at its output. Each power amplifier has an input connected to a single common RF source 20. The RF source 20 serves as the single source of an RF carrier signal which is supplied by way of an RF splitter 22 so that each amplifier $PA_1$-$PA_N$ receives a signal of like amplitude and phase and frequency. The carrier signal is amplitude modulated in accordance with the control signals D1-DN and the amplitude modulated carrier signals will be of like frequency and phase. These signals are supplied to a combiner circuit 24 comprised of a plurality of transformers $T_1, T_2, \ldots, T_N$. The secondary windings act as an independent signal source, whereby the signals provided by the various transformers additively combine with one another to produce a combined signal which is supplied to the load 14. This combined signal has the same frequency as the RF signal supplied by the RF source 20, but the amplitude of the combined signal is modulated in accordance with the input signal supplied by the input source 12.

As is conventional in such a system, the RF source 20 includes an RF oscillator 21 having a frequency on the order of 500 to 1600 KHz. This oscillator feeds an RF driver 23, the output of which is supplied to the power amplifiers $PA_1$-$PA_N$. The RF driver provides power amplification of the RF signal obtained from oscillator 21 prior to the signal being supplied to the power amplifiers at which modulation also takes place. The RF driver 23 may include several stages of amplification and may be configured similar to the power amplifiers $PA_1$-$PA_N$.

FIG. 2 illustrates one form which the power amplifier $PA_1$ of FIG. 1 may take, the other power amplifiers $PA_2$-$PA_N$ being similar. The power amplifier illustrated includes four semiconductor amplifier elements 70, 72, 74 and 76 connected in a bridge arrangement across a DC power supply voltage of, for example, 250 volts. The primary winding 44 of the associated transformer 36 is connected across the bridge junctions $J_1$ and $J_2$ of the four semiconductor elements.

More particularly, the semiconductor amplifier elements are metal oxide semiconductor, field effect transistors (MOSFETs) having three electrodes, conventionally identified as the gate, drain, and source. The drain-source paths of the transistors 70 and 72, representing their primary current paths, are connected in series across the DC power supply, as are the drain-source current paths of transistors 74 and 76. The primary winding 44 of the corresponding combiner transformer T1 is connected in series with a DC blocking capacitor 78 across the common junctions $J_1$ and $J_2$ between transistors 70 and 72 and transistors 74 and 76.

The transistors 70, 72, 74 and 76 effectively operate as switches to connect the two sides of the primary winding 44 to either the DC voltage source or to ground. By proper operation of these transistors, the transformer winding 44 can be connected in either direction across the DC power supply.

This can perhaps be more readily understood by reference to FIG. 2A, which is a simplified illustration of the FIG. 2 circuitry. In FIG. 2A the transistors 70, 72, 74 and 76 are respectively characterized by conventional single pole, single throw switches $S_1, S_2, S_3$, and $S_4$. As shown in FIG. 2A, the switch $S_1$ is open and the switch $S_2$ is closed, whereby the common junction $J_1$ between them is grounded. The switch $S_3$ is closed and the switch $S_4$ open, however, whereby the junction $J_2$ between those switches is connected to the DC supply voltage. Current will therefore pass through the primary winding 44 in the direction indicated by the arrow 80.

When all four switches $S_1$-$S_4$ are thrown to their opposite states, current will pass through the output winding 44 in the opposite direction. Thus, when switches $S_1$ and $S_4$ are closed and switches $S_2$ and $S_3$ opened, junction $J_1$ is connected to the DC supply and junction $J_2$ is connected to ground. In this case the current through the primary winding 44 of the transformer is in a direction opposite to that indicated by arrow 80 of FIG. 2A. An AC signal can thus be applied across the coil 44 by cyclically switching the switches $S_1$-$S_4$ between these two alternate states. If this is done at RF frequencies, then an RF carrier signal results.

Referring back to FIG. 2, the transistor switches 70, 72, 74 and 76 are controlled by signals applied to their gate electrodes. The gate signals for all four transistors are derived from individual secondary transformer windings. This transformer has a toroidal ferrite core with a primary winding 82 and four secondary windings 84, 86, 88 and 90 wound around it. The turns ratio of the transformer is 1:1, whereby the same signal appearing at the primary is applied to each of the circuits connected to the four secondary windings.

Each of the four secondary windings is connected between the gate and source electrodes of an associated one of the MOSFETs 70-76. The secondary 84 is directly connected between the gate MOSFET 70 and junction $J_1$, while secondary 88 is similarly directly connected between the gate of MOSFET 74 and junction $J_2$. The secondary windings 86 and 90 are in like manner connected between the gate and source electrodes of MOSFETS 72 and 76, however in these cases impedance networks 92 and 94 are connected in series with the coils 86 and 90, respectively. Each impedance network 92, 94 includes a parallel combination of a resistor 96, 98 and capacitor 100, 102. The purpose of these impedance networks will be described hereinafter during the description of the amplifier control circuitry 104.

The primary winding 82 of the toroidal transformer is connected to the output of the RF source 20, which provides a sinusoidal RF driving voltage to the power amplifier Each MOSFET turns "on" when the RF signal applied to its gate is on its positive half cycle and "off" when the applied signal is on its negative half cycle. The MOSFETs therefore cyclically turn on and off at a frequency and phase of the applied RF gate signal. The windings 84 and 90 are connected across MOSFETs 70 and 76 in similar directions whereby the signals appearing at the gates of these transistors are in phase with one another. MOSFETs 70 and 76 therefore turn on and off in unison Windings 86 and 88, on the other hand, are connected across MOSFETs 72 and 74 in a direction opposite to the direction of connection of the windings 84 and 90. The signals applied to the gates of MOSFETs 70 and 76 are therefore 180° out of phase with respect to the signals applied to the gates of transistors 74 and 72. Consequently, when transistors 70 and 76 are "on", transistors 72 and 74 are "off", and vice versa.

Due to the nonlinear transfer characteristics of the MOSFETs 70, 72, 74 and 76, the MOSFETs will abruptly turn on and off in response to the applied sinusoidal signal, rather than linearly following it. The signal applied across the junctions $J_1$ and $J_2$ will therefore have essentially a squarewave form, though at the frequency of the applied RF input signal. The load 14 to which the output of the combiner circuit 24 of FIG. 1 is connected will generally be frequency selective, and will select only a fundamental component of this squarewave.

As shown in FIG. 2, the power amplifier $PA_1$ includes a switching circuit 104 for turning the power amplifier on and off in response to the control signal appearing on the digitizer output line $D_1$. The switching circuit 104 includes an NPN bipolar junction transistor 106 having its emitter grounded and its collector connected to the gates of MOSFETs 72 and 76 through corresponding diodes 108 and 110. The base of the transistor 106 is connected to the $D_1$ output of the digitizer 24 through a base resistor 112. When the control signal applied to the base resistor 112 has a high logic level (i.e., logic "1"), base current is applied to the transistor 106, forcing it into a saturation. The gates of the transistors 72 and 76 are then effectively grounded through the corresponding diodes 108 and 110. This has the effect of clamping the gate signals of these transistors to a ground potential, thereby forcing both of them to remain in an "off" condition. The primary winding 44 is thus effectively disconnected from ground, thereby turning off the power amplifier.

The resistors 96 and 98 in the gate circuits of MOSFETs 72 and 76 limit the DC current through transistor 106 when it is saturated. Were these not included the current through the transistor 106 would be quite high because the windings 86 and 90 act as voltage sources. The capacitors 100 and 102 bypass the resistors, reducing their effect at RF frequencies. A third capacitor 114 is connected between both capacitors 100 and 102. This capacitor improves the turn-on/turn-off characteristics of the amplifier.

When the control signal applied to the base of transistor 106 is at a low logic level (i.e. logic "0"), the transistor 106 is cut off and the operation of the amplifier 26 is substantially as described previously. However, this logic 0 signal is a negative signal and it serves to turn on PNP transistors 95 and 97 through base drive resistors 91 and 93, respectively. When these transistors are turned on forcing them into saturation, they, in turn, rapidly drive the MOSFET switching transistors 72 and 76 into saturation.

The turn on control signal applied to transistors 95 and 97 must be sufficient to drive these transistors into saturation so that the MOSFET switching transistors operate as switches and not resistors which could cause excessive MOSFET dissipation, high stress and potential failure. This turn on or binary "0" signal is a negative DC voltage.

The modulating audio input signal 12 is supplied to an analog processing circuit 33 which adds a DC level to the audio signal and provides this audio plus DC level to a DC regulator 35 which supplies regulated DC voltage to a digitizer 16. The output of the analog processing circuit 33 is also supplied to an analog divider circuit 39 which divides the audio frequency signal by a sample voltage $V_1$ and which is a sample of the power supply DC voltage $V_{DC}$. The audio frequency signal divided by the sample voltage $V_1$ is supplied to an analog-to-digital converter 37. The converter 37 converts the signals into a digital representation thereof and which may be internally decoded to provide a number of control signals D1–DN. The number of the control signals that are supplied by digitizer 16 will vary with the magnitude of the audio signal and DC level received from the audio input. The digitizer supplies either a binary 1 (turn off signal) or binary 0 (turn on signal) to the respective power amplifiers $PA_1$–$PA_N$. The operation is otherwise as described hereinbefore.

The sample signal $V_1$ that is supplied to the divider 39 is illustrated in FIG. 1 as being obtained from a correction circuit 41 having its input taken from the midpoint of a voltage divider made up of series connected resistors 43 and 45. This voltage divider is connected across the output of a suitable power supply circuit such as a three phase rectifier 17 connected across a line voltage source 19. It is conventional with such power supplies to have a capacitor C connected across the power supply with the capacitor having a value on the order of 0.5 farads The DC voltage $V_{DC}$ may be on the order of 230 volts.

The prior art distortion correction circuits identified hereinbefore obtained the sample voltage $V_1$ directly from the voltage divider and not by way of a correction circuit, such as circuit 41 in FIG. 1. Attention is now directed to a more detailed description of the correction circuit presented with respect to FIG. 3 and the waveforms of FIGS. 4, 5 and 6.

The correction circuit 41 as depicted in FIG. 3 receives a sample voltage from the voltage divider comprised of resistors 43 and 45 with the sample voltage having a value on the order of approximately 10 volts DC. This sample voltage is supplied to a low-pass filter 47 which serves to predominantly pass the DC component of the sample voltage. The sample voltage is also supplied to a phase compensator 49 and then to a high pass filter 51 which removes the DC component and passes only the AC component of the sampled voltage.

As will be brought out hereinafter, the AC component is phase changed by the compensator 49 and its gain is changed with an adjustable potentiometer 65 in the high pass filter. The AC and DC components are then summed together in a summing circuit 53 to provide an adjusted correction signal at the output circuit 67 of the summing circuit which is then applied as the correction signal $V_1$ to the divider 39 described hereinbefore.

The low-pass filter 47 is a 2 Hz active low-pass filter that serves to predominantly pass the DC component of the sample voltage. The filter 47 employs an amplifier 55 having its positive or noninverting input connected to ground by way of a resistor 57. The negative input of the amplifier is connected to the junction of resistors 43 and 45 to obtain the sample voltage therefrom by way of input resistor 59. As is conventional, the low-pass filter includes a resistor 61 and a capacitor 63 connected together in parallel between the output of the amplifier and the negative input This is a first order low-pass filter and with the components employed may exhibit a gain on the order of 0.36 in the pass band.

As is shown in FIG. 3, the phase compensator 49 includes an RF bypass capacitor 200 connected in parallel with a resistor 202 across the resistor 45. Capacitors 204 and 206 are connected together in parallel and extend from the junction of capacitor 200 and resistor 202 and thence in series with a resistor 208 to the high pass filter 51. The capacitors 204 and 206 together with the resistor 208 are the primary components for providing phase change. The phase change caused by the phase compensator 49 is to correct for the change in phase that takes place in the AC component of the power supply voltage $V_{DC}$ between the output of the three phase rectifier 47 and the amplitude modulated output of the transmitter.

The high pass filter 51 is a single order high pass filter and with the components employed exhibits a variable gain in the pass band of 0.13 to 0.45. The three db cutoff frequency for this example is about 2 Hz The filter 51 includes an amplifier 210 having its positive or noninverting input connected to ground by way of a resistor 212. The feedback path between output and the negative input includes potentiometer 65 connected in series with a fixed resistor 214. As the resistance of potentiometer 65 is increased, the gain will increase to increase the magnitude of the AC component passed by the filter 51.

The summing amplifier 53 includes an amplifier 220 having its positive or noninverting input connected to ground by way of a resistor 222. A resistor 224 and a capacitor 226 are connected together in parallel between the output and negative input of the amplifier 220 as is conventional. The output from the summing amplifier is taken at output circuit 67 connected by way of a resistor 228 to the output of amplifier 220. The outputs of filters 47 and 51 are applied through resistors 230 and 232, respectively, to the negative input of amplifier 220 in the summing amplifier circuit 53. The summing amplifier provides unity gain for each of these inputs The resultant output at output circuit 67 is on the order of 3.6 volts DC for the 10 volt input.

Figure 4:
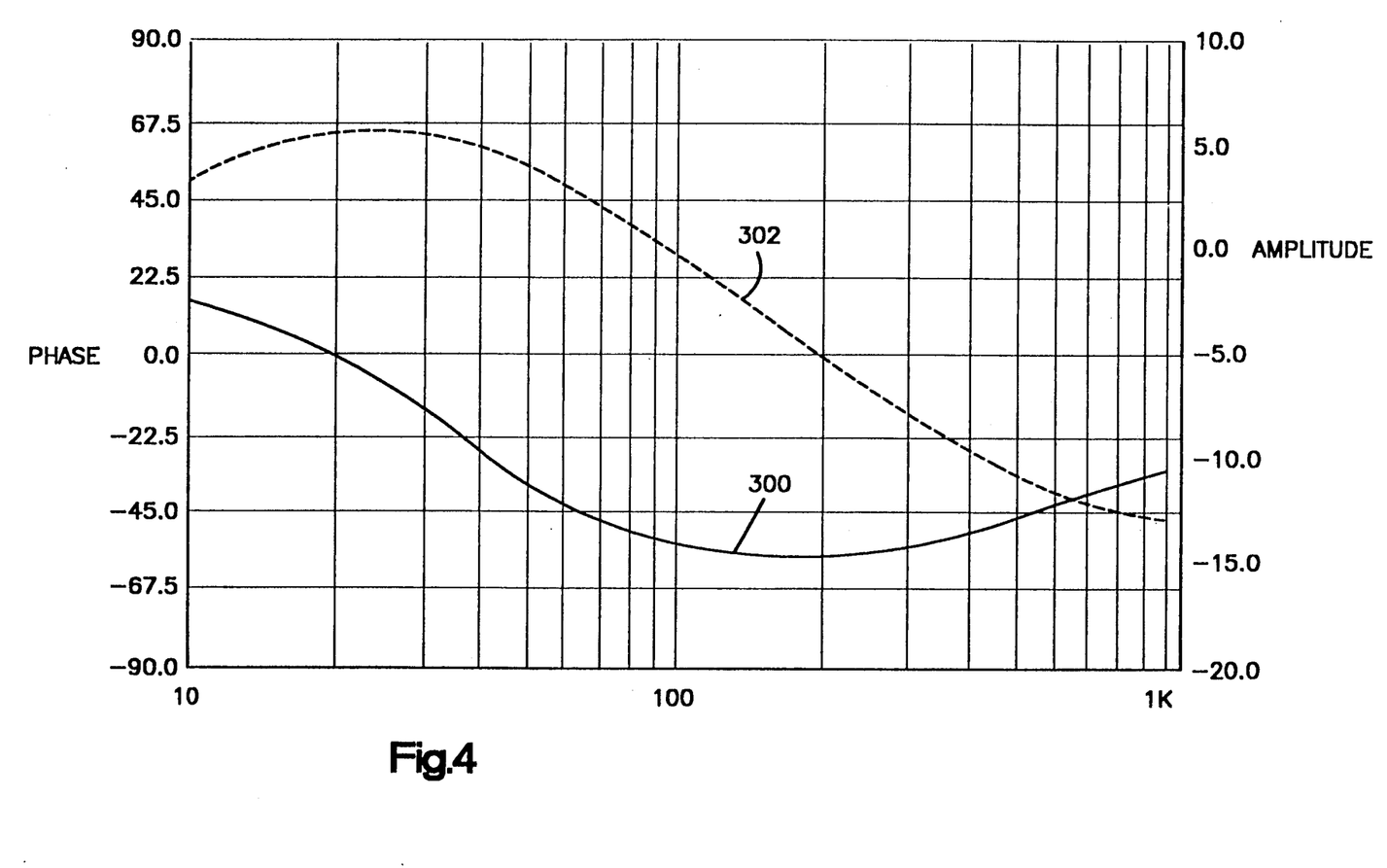
FIG. 4 is a graphical illustration showing phase and amplitude with respect to frequency useful in describing the invention herein.

Reference is now made to FIG. 4 which shows the phase response and the amplitude response at output circuit 67 in FIG. 3. The phase response is illustrated by curve 300 and the amplitude response is illustrated by curve 302. The phase response curve 300 shows the phase angle in degrees with respect to frequency from 10 Hz to 1 kHz. The amplitude response is given in db over a frequency range from 10 Hz to 1 kHz. This presents test results of an active correction circuit showing phase and amplitude response of the circuit of FIG. 3 that is required to provide optimum performance at 100 kilowatts of operation over a frequency range from 10 Hz to 1 kHz. The phase response curve 300 shows that $-50°$ phase shift is required at 100 Hz to compensate for power supply sag when the power amplifiers are operating at 100 kilowatts. Similarly, the amplitude response curve 302 shows that a 5 db gain is required at 20 Hz to correctly compensate for power supply sag when operating at 100 kilowatts. These adjustments are provided by the circuitry of FIG. 3.

Figure 5A:
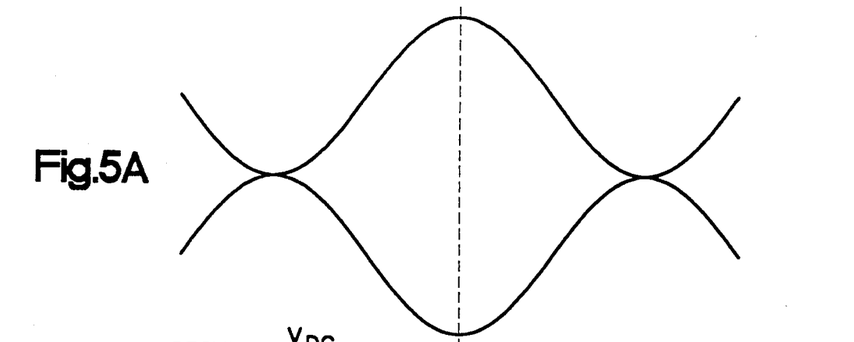
FIGS. 5A 5B and 5C include waveforms showing the operation of circuitry in accordance with the prior art without the correction circuit of the present invention.
Figure 5B:
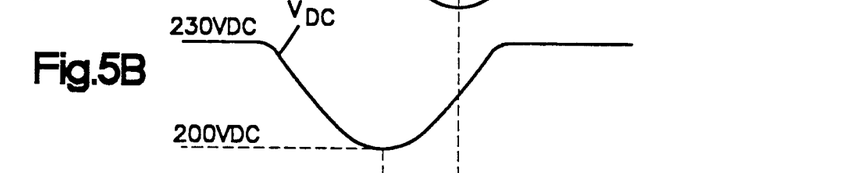
Figure 5C:
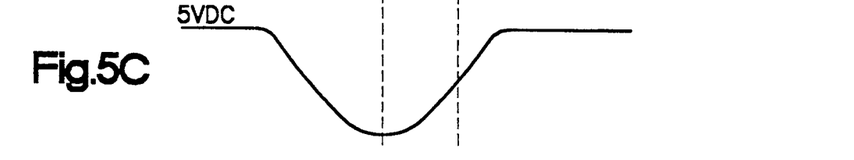

Reference is now made to waveforms in FIGS. 5A, 5B and 5C. The waveform of FIG. 5A represents the RF envelope of the RF output signal taken from transmitter at the load 14 of FIG. 1. FIG. 5B illustrates the AC component of the power supply voltage $V_{DC}$ which shows that a phase shift takes place between the input and the output and this may, for example, be on the order of 10°. If a correction signal is provided in accordance with the prior art referred to hereinabove (which does not include the correction circuit 41) then the correction signal as shown in the waveform of FIG. 5C will be of the same phase as the power supply voltage $V_{DC}$ and, hence, will not result in a proper correction for this phase shift.

Figure 6A:
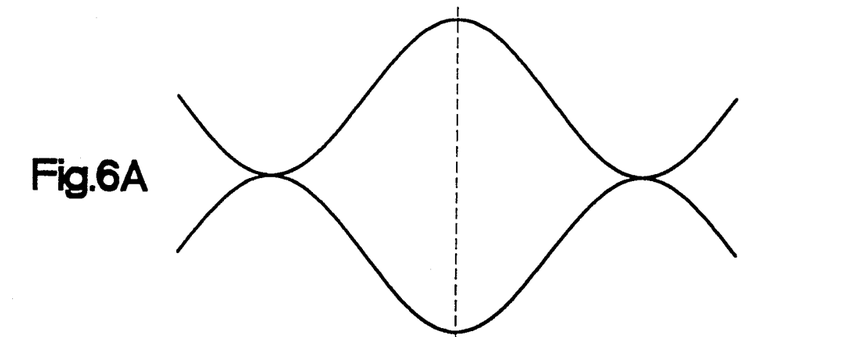
FIGS. 6A 6B and 6C include waveforms showing the operation resulting with the inclusion of the correction circuitry in accordance with the present invention.
Figure 6B:
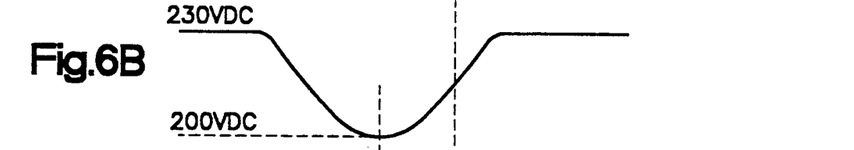
Figure 6C:
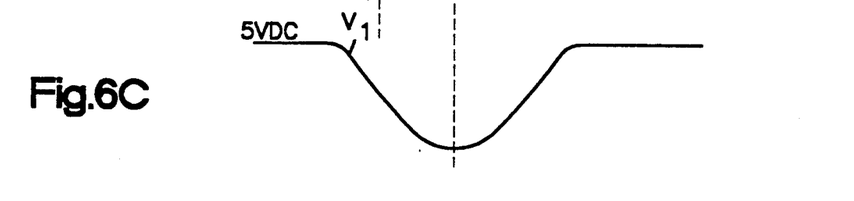

The waveforms in FIGS. 6A and 6B correspond with those in FIGS. 5A and 5B. However, the waveform in FIG. 6C represents a correction signal provided in accordance with the present invention by employing the correction circuit 41 of FIG. 3. This provides a phase shift for the correction signal. More specifically, this shows the lagging phase shift in the power supply is phase corrected by the correction circuit of the invention herein to allow the signal to the analog divider 39 to be the proper phase and amplitude for minimum distortion.

Although the invention has been described with respect to a preferred embodiment, it is to be appreciated that various modifications may be made without departing from the spirit and scope of the invention as defined in the appended claims.

Having described the invention, the following is claimed:

1. An amplifier system having distortion reduction and comprising:
    a DC voltage source having AC and DC components;
    means for providing an input signal to be amplified;
    amplifier means coupled to said DC voltage source for amplifying said input signal to provide an output signal in accordance therewith;
    correction signal means for providing a correction signal including means for separating said AC and DC components and means for controlling the magnitude and phase of said AC component independently of said DC component to provide an adjusted AC component and means for summing said DC component and said adjusted AC component to provide an adjusted correction signal; and
    means for combining said adjusted correction signal with said input signal prior to application of said input signal to said amplifier means.

2. A system as set forth in claim 1 wherein said correction signal means includes means for varying said AC component to adjust the magnitude of said AC component independently of said DC component.

3. A system as set forth in claim 2 wherein said means to vary includes second amplifier means and adjustable gain control means for varying the gain of said second amplifier means.

4. An amplifier system as set forth in claim 1 wherein said separating means includes low-pass filter means for passing only said DC component and high pass filter means for passing only said AC component.

5. A system as set forth in claim 4 wherein said correction signal means includes means for varying said AC component to adjust the magnitude of said AC component independently of said DC component.

6. A system as set forth in claim 4 wherein said means to vary includes second amplifier means and adjustable gain control means for varying the gain of said second amplifier means.

7. An amplifier system as set forth in claim 4 wherein said means for combining includes means for dividing said input signal by said adjusted correction signal.

8. An amplifier system as set forth in claim 7 wherein said amplifier means includes a plurality of actuatable RF power amplifiers, each connected to said DC source, and each, when activated, for receiving and amplifying an RF drive signal, and each having an output circuit for providing an amplified RF output signal.

9. An RF power amplifier system having distortion reduction and comprising:
a DC voltage source having AC and DC components;
an RF source for providing an RF drive signal;
a plurality of actuatable RF power amplifiers, each connected to said DC source, and each, when actuated, for receiving and amplifying said RF drive signal, and each having an output circuit for providing an amplified RF output signal;
means for providing an input signal;
means for actuating a selected one or more of said RF amplifiers in dependence upon the magnitude of said input signal;
means for additively combining said RF output signals to provide a combined RF output signal;
correction signal means for providing a correction signal including means for separating said AC and DC components and means for controlling the magnitude and phase of said AC component independently of said DC component to provide an adjusted AC component and means for summing said DC component and said adjusted AC component to provide an adjusted correction signal; and
means for combining said adjusted correction signal with said input signal prior to actuation of one or more of said RF amplifiers.

10. A system as set forth in claim 9 wherein said correction signal means includes means for varying said AC component to adjust the magnitude of said AC component independently of said DC component.

11. A system as set forth in claim 10 wherein said means to vary includes amplifier means and adjustable gain control means for varying the gain of said amplifier means.

12. An amplifier system as set forth in claim 9 wherein said separating means includes low-pass filter means for passing only said DC component and high pass filter means for passing only said AC component.

13. A system as set forth in claim 12 wherein said correction signal means includes means for varying said AC component to adjust the magnitude of said AC component independently of said DC component.

14. A system as set forth in claim 12 wherein said means to vary includes amplifier means and adjustable gain control means for varying the gain of said amplifier means.

15. An amplifier system as set forth in claim 12 wherein said means for combining includes means for dividing said input signal by said adjusted correction signal.

* * * * *